United States Patent [19]

Goodner et al.

[11] 4,222,839

[45] Sep. 16, 1980

[54] WORKPIECE HOLDER AND METHOD FOR PLASMA REACTOR APPARATUS

[75] Inventors: Willis R. Goodner, Chandler, Ariz.; Joseph P. Y. Kao, Berkeley, Calif.

[73] Assignee: Motorola, Inc., Schaumburg, Ill.

[21] Appl. No.: 944,427

[22] Filed: Sep. 21, 1978

[51] Int. Cl.$^2$ ............................ C23F 1/00; B01K 1/00
[52] U.S. Cl. ................................ 204/192 E; 204/298; 156/345; 156/643
[58] Field of Search .......................... 204/298, 192 E; 118/49.1, 49.5, 666, 728; 156/345, 643

[56] References Cited

U.S. PATENT DOCUMENTS

| | | | |
|---|---|---|---|
| 3,573,190 | 3/1971 | Bloom | 204/298 |
| 3,780,255 | 12/1973 | Boom | 219/121 P |
| 4,115,184 | 9/1978 | Poulsen | 156/626 |
| 4,141,811 | 2/1979 | Yerkes et al. | 204/192 E |

OTHER PUBLICATIONS

H. M. Gartner et al., In Situ Thermal Control/Monitor System for Reactive Ion Etch Process, IBM Technical Disclosure Bulletin vol. 20 No. 3 (8/77) p. 994

*Primary Examiner*—John H. Mack
*Assistant Examiner*—William Leader

*Attorney, Agent, or Firm*—John A. Fisher

[57] ABSTRACT

A holder and method for controlling and uniformly maintaining the temperature of work pieces when the work pieces are acted upon by a plasma in a plasma reactor apparatus. Support means which hold the work pieces so as to expose them to the reactive plasma also position metallic plate members which are capable of being heated to an elevated temperature by the plasma when in electrical contact with an electrode of the plasma reactor apparatus. The metallic plate members are all electrically shorted together, but are insulated from the support means. A temperature sensitive switch connects the metallic plate members to an electrode of the plasma apparatus. Work pieces to be acted upon by the plasma are placed in proximity to the metal plate members. In the presence of a plasma and when shorted to the apparatus electrode, the metallic plate members are rapidly heated and heat is conducted to the work pieces to heat them uniformly. The temperature of the work pieces is controlled by selectively opening and closing the temperature sensitive switch and thereby selectively shorting the metal members to the apparatus electrode. Little heating occurs when the switch is open and the members are isolated from the electrode.

9 Claims, 2 Drawing Figures

WORKPIECE HOLDER AND METHOD FOR PLASMA REACTOR APPARATUS

BACKGROUND OF THE INVENTION

This invention relates to a workpiece holder and method for use in a plasma reactor apparatus, and more particularly to the workpiece holder and method which provide temperature control and uniformity of heat distribution to the work pieces.

Plasma reactions are finding widespread usage in a number of applications, especially in the semiconductor industry. In the semiconductor industry, for example, plasma reactions are used for etching, ashing, or the like. In etching, the plasma reaction is typicaly used to selectively pattern or etch a layer of oxide, nitride, or polycrystaline semiconductor material or to etch moats in a semiconductor wafer itself. In ashing, the plasma reaction can be used to strip a layer of photoresist or other material from the semiconductor wafer as a stripping or cleaning process. In such operations the wafers or other work pieces are loaded into a boat or holder. The boat and work pieces are placed in a plasma reactor apparatus, an appropriate reactive gas in introduced, and RF power is applied to the apparatus to form a reactive plasma of this gas which can interact with the work pieces. The holder supports and positions the work pieces to properly expose them to the reactant plasma. As the reaction proceeds, the work pieces and holder are heated by two mechanisms. First, heating is produced by thermal transfer from the molecules in the plasma. This produces a slow heating and is a function of such variables as the RF power, the pressure within the reactor, and the gas selected for the reaction. Second, if the holder is metallic, as is often the case, and the holder is in contact with one of the electrodes of the RF circuit, the holder then becomes a part of the RF circuit and is heated by Joule heating. This heating can be very rapid and can cause a temperature rise of several hundred degrees Celsius. The rate of a plasma reaction is typically a strong function of temperature, with the reaction rate increasing rapidly as the temperature increases. Because of this, uncontrolled or non-uniform heating of the workpieces can provide a serious problem.

As a specific example, semiconductor wafers are typically positioned vertically in a boat. The boat has three or four slotted or notched rails and the wafers are placed in and held by these notches. If the boat is metallic and is in contact with an electrode of the plasma apparatus, the boat heats rapidly and transfers heat from the rails to the wafer at those points where the wafer and rails are in contact. Thus, the contact points of the wafer are raised to a higher temperature than the rest of the wafer and the plasma reaction is non-uniform across the wafer. This can occasion undercutting, non-uniform etching, poor pattern definition, and the like, all of which lead to reduced yield. In addition, in some applications such as ashing it is desireable to heat the wafers so as to enhance the reaction rate and thus increase the through-put. Prior art workpiece holders have failed to consider the very important aspects of temperature control and heating.

Because of the deficiencies of the prior art workpiece holders, it is an object of this invention to provide an improved workpiece holder and method which provide for controlling the temperature of the workpieces and provide for a uniform temperature distribution across the workpieces.

SUMMARY OF THE INVENTION

In one embodiment of the invention, slotted rails made of an electrically insulating material are provided to hold workpieces in an upright position. Positioned between the rails are metallic plate members in contact with which the work pieces can be placed. The metallic members are connected together electrically and can be selectively shorted to one electrode of the plasma reactor apparatus. The selective shorting can be accomplished by a temperature sensitive switch which allows the metal members to be controllably heated. The heated metal members, in turn, provide uniform conductive heating to the workpieces placed in contact with them.

BRIEF DESCRIPTION OF THE DRAWINGS

Other objects and advantages of the invention will become apparent upon reading the following detailed description taken in connection with the drawings in which.

DETAILED DESCRIPTION OF THE INVENTION

Figure 1:
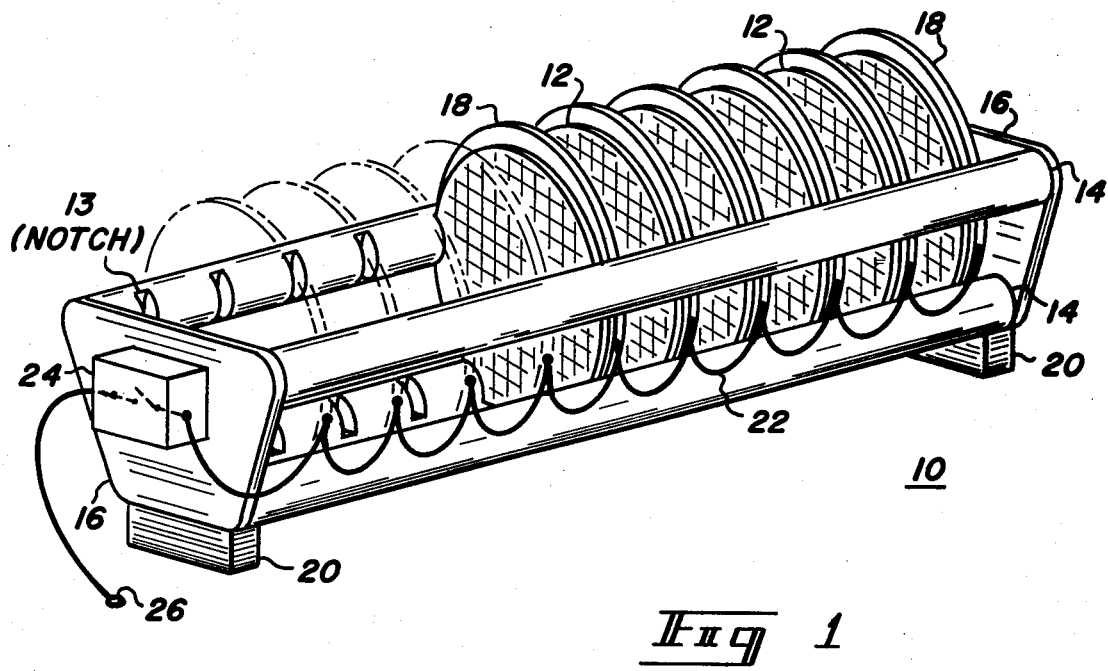
FIG. 1 is a perspective view of one embodiment of the invention.

FIG. 1 shows a workpiece holder 10 for use in a plasma reactor apparatus in accordance with a preferred embodiment of the invention. In this embodiment the holder is shown to be a four rail boat for holding semiconductor wafers. The invention is not to be limited to this embodiment, however, and in this and various other embodiments the holder could support semiconductor wafers, small machine parts, optical lenses, or the like.

The holder 10 can support a plurality of semiconductor wafers 12. The semiconductor wafers rest in and are supported by slots or notches 13 in the four boat rails 14. The rails 14 are, in turn, held in position by end pieces 16. Also held in position by the rails 14 are a plurality of metallic plates or disks 18. The slotted rails 14 hold the disks in an upright position and hold the semiconductor wafers 12 in physical contact with or in close proximity to the disks. The rails 14 and end pieces 16 are fabricated of an electrically insulating material such as plastic, quartz, or ceramic. Alternatively, they could be fabricated of metal or the like and then coated with an insulating material. As a further alternative, the rails and end pieces could be fabricated from metal or other conductive material, but then the end pieces 16 should sit on insulator feet 20. In this latter embodiment the metallic disks 18 must also be insulated from the rails 14. In any of these embodiments, the metallic disks 18 are shorted together by a shorting strap 22. The shorting strap 22 is in series with a switch element 24 and terminal connector 26. The switch 24 can selectively short or isolate the metallic disks 18 from the terminal connection 26. In operation, the terminal connection 26 is connected to one electrode of the plasma reactor apparatus. Depending upon whether the switch 24 is open or closed, the metallic plates 18 are thus insulated from or shorted to the plasma apparatus electrode. The switch 24 can be of the type which is thermally activated such as by a bi-metallic strip temperature sensor. Alternatively, the switch could be preprogrammed, controllable from outside reactor apparatus, time controlled, or the like. The function of the switch 24 is to selectively interconnect metallic plate members 18 with an electrode 28 or the plasma apparatus and thus to control the temperature of the members. The metal plate members 18 can be of aluminum or any other readily available and easily workable metal and should be slightly larger in size than the work pieces. When the workpiece is, for example, a semiconductor wafer with a diameter of about 75 millimeters, the disk can be about 85 millimeters in diameter and have a thickness of about 0.5 to 0.75 millimeter.

In operation, a plurality of workpieces such as semiconductor wafers 12 are loaded into the workpiece holder 10. Each wafer is placed in contact with or in close proximity to a metallic plate member 18. The thus loaded workpiece holder is placed in a plasma reactor apparatus and the terminal connector 26 is connected to one electrode of the apparatus. This is especially convenient in those plasma reactors in which the metallic inner wall of the apparatus is one of the electrodes. The apparatus is filled with a reactant gas and power is applied to create a plasma of that gas. If the switch 24 is initially closed, the metallic plate members 18 will be in electrical contact with an electrode and will be heated by Joule heating. As the plate member rapidly rises in temperature, the workpiece 12 is uniformly heated by its proximity to the broad heated surface of the plate member 18. This is in distinct contrast to prior art structures in which the wafer was physically supported only at the point of contact with the rails. The switch 24 can be preset to open at a prescribed time or when the metal members get to a prescribed temperature. Thus, for example, if the switch 24 contains a bi-metallic strip control element, this switch might be preset to open and interrupt the circuit at a temperature of say 200° C. Thus the wafers 12 would be uniformly and rapidly heated to that temperature, and then maintained at 200° C. or heated above that temperature only very slowly by thermal transfer from the molecules in the plasma. Alternatively, the switch 24 could be such as to produce a series to preset temperature rises by alternately opening and closing at predetermined temperatures or times.

Figure 2:
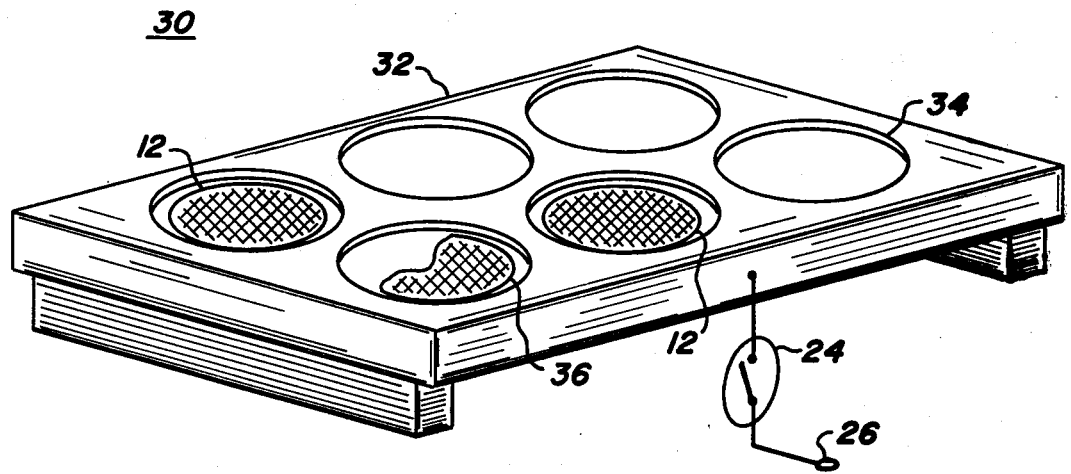
FIG. 2 is a perspective view of a further embodiment of the invention.

FIG. 2 shows an alternate embodiment of a workpiece holder 30. Again, this holder is shown in a form which is adapted for use with semiconductor wafers as the particular workpieces, but the invention is not to be so limited. The holder 30 is a flat metallic plate or tray 32. The upper surface of the plate 32 can have a series of shallow depressions 34 which act to locate and confine the wafers 12. As with the previously described embodiment, a switch 24 can provide selective interconnection between the plate 32 and a terminal connection 26 which is electrically affixed to an electrode of the plasma reactor apparatus. The holder 30 functions in the same manner as the holder 10 of FIG. 1. Holder 30 cannot hold and position as many workpieces, and thus results in a reduced throughput when contrasted with the first embodiment holder. Holder 30 can, however, accommodate a variety of workpiece sizes and shapes such as a partial wafer 36. Also, the planar array of workpieces provided by the holder 30 may improve the plasma flow uniformity in the vicinity of the workpieces in situations which require tight flow control for enhanced uniformity of the plasma reaction.

The following non-limiting examples will further illustrate the practice of the invention.

EXAMPLE I.

A workpiece holder as shown in FIG. 1 is provided. The end pieces and supports are of quartz and the metal plate members are aluminum disks. Twenty-five silicon wafers are loaded into the holder, each in contact with one of the metal members. The wafers have a layer of patterned photoresist of about 7000 Angstroms thickness on one surface which has been used as an etch mask. The holder and wafers are loaded into a Tegal Model 200 plasma reactor, a product of the Tegal corporation of Richmond, California. A temperature sensitive switch employing a bi-metallic strip is connected between a shorting strap which shorts together the metal plate members and the internal electrode of the plasma reactor. The switch is set to open at a temperature of 250° C. to allow rapid heating of the wafers without deleterious effects that might result from high temperatures. Oxygen is injected into the reactor and the power is set for 300 watts. After ashing for 15 minutes the reaction is terminated and the wafers are inspected. The photoresist is observed to have been completely and uniformly removed from the wafers. There is no thermally induced damage to the underlying wafers.

EXAMPLE II

Twenty-five silicon wafers are again loaded into a holder similar to that used in Example I. The wafers have a patterned photoresist layer overlying a 4000 Angstrom thick layer of silicon nitride which is to be plasma etched in a pattern replicating the pattern in the photoresist layer. Beneath the nitride layer is a layer of silicon dioxide of about 500–1000 Angstroms to act as a plasma etch stop and to protect the underlying silicon wafer. The nitride layer must be etched uniformly to insure that the pattern is fully etched without etching through the oxide etch stop layer and damaging the silicon. The wafer holder is loaded into the reactor and the thermal switch is set to limit the temperature to 60° C. The etching is done in a $CF_4$—$O_2$—$N_2$ plasma at a power of 50 watts. After 20 minutes the reaction is terminated and the wafers are inspected. The pattern in the nitride layer is observed to be fully and uniformly etched. The oxide layer is intact everywhere on the wafers and the silicon wafer is unetched.

Thus it is apparent that there has been provided, in accordance with the invention, an improved workpiece holder and method for use in a plasma apparatus that fully satisfies the objects and advantages set forth above. While the invention has been described in conjunction with specific embodiments, it is evident that many alternatives and modifications will be apparent to those skilled in the art in light of the foregoing description. Accordingly, it is intended to embrace all such alternatives and modifications as fall within the broad scope and spirit of the appended claims.

What is claimed is:

1. In a workpiece holder in combination with a plasma reactor apparatus for controlling the temperature of workpieces during a chemical reaction, said plasma reactor having an RF generator for supplying energy to generate a plasma, a reaction chamber and at least two electrodes within said chamber, the improvement in said workpiece holder comprising: a metallic member in proximity to which the workpiece can be placed, and temperature actuated connecting means, one of said member being selectively connected electrically to said electrodes of said plasma reactor apparatus by said temperature actuated means.

2. The workpiece holder of claim 1 wherein said metallic member comprises a metallic plate.

3. The workpiece holder of claim 1 wherein said temperature actuated means comprises a switch capable of actuation in response to a bi-metallic strip sensor.

4. A holder for controlling the temperature of workpieces in combination with a plasma reactor apparatus, said apparatus having an RF generator, a reaction chamber and at least two electrodes within said chamber for supplying energy to generate a plasma wherein said holder comprises: means for supporting the workpieces, metallic means positioned by said means for supporting to be in proximity to a workpiece supported in said holder, said metallic means capable of being heated to an elevated temperature by a plasma in said plasma reactor apparatus when said metallic means are in electrical contact with one of said electrodes of said apparatus; switch means for selectively electrically connecting said metallic means and said electrode in response to said temperature.

5. The holder of claim 4 wherein said means for supporting comprises electrically insulated slotted rails.

6. The holder of claim 5 wherein said metallic means comprises metallic plate members supported by said rails and positioned approximately at right angles thereto.

7. A wafer holder for supporting and controlling the temprature of a wafer in combination with a plasma reactor apparatus having an RF generator, a reaction chamber and at least two electrodes within said chamber for supplying energy to generate a plasma, said holder comprising in combination: a plurality of rail members positioned in a substantially parallel arrangement and capable of supporting the wafer at an edge thereof; metallic plate members positioned between said rail members, said metallic plate members capable of being heated to an elevated temperature by a plasma when in electrical contact with one of said electrodes of said plasma reactor apparatus; and switch means selectively connecting said metallic plate members to said electrode to control the temperature of said workpieces.

8. A holder for workpieces in combination with a plasma reactor apparatus, said reactor having an RF generator, a reaction chamber and at least two electrodes within said chamber for supplying energy to generate a plasma, said combination comprising: a metallic plate member for supporting said workpieces and capable of being heated by a plasma when in electrical contact with one of said electrodes of said plasma reactor apparatus; and a temperature sensitive selective switch means for connecting said plate member to said electrode to control the temperature of said workpieces.

9. A method for controlling the temperature and for providing a uniform heating of a workpiece during a plasma reaction in a plasma reactor apparatus having an RF generator, a reaction chamber and at least two electrodes within said chamber for supplying energy to generate a plasma, which comprises: placing the workpiece in contact with a metallic member of a workpiece holder; and selectively electrically connecting said metallic member to one of said electrodes of said plasma reactor apparatus whereby said metallic members are heated to a selected elevated temperature and conductively heat said workpieces.

* * * * *